US 7,772,900 B2

(12) United States Patent
Ainspan et al.

(10) Patent No.: US 7,772,900 B2
(45) Date of Patent: Aug. 10, 2010

(54) PHASE-LOCKED LOOP CIRCUITS AND METHODS IMPLEMENTING PULSEWIDTH MODULATION FOR FINE TUNING CONTROL OF DIGITALLY CONTROLLED OSCILLATORS

(75) Inventors: Herschel A. Ainspan, New Hempstead, NY (US); Daniel J. Friedman, Sleepy Hollow, NY (US); Alexander V. Rylyakov, Mount Kisco, NY (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/173,140

(22) Filed: Jul. 15, 2008

(65) Prior Publication Data

US 2010/0013531 A1 Jan. 21, 2010

(51) Int. Cl.
*H03L 7/06* (2006.01)
(52) U.S. Cl. .................. 327/159; 327/156; 327/162; 374/376
(58) Field of Classification Search .................. 327/141, 327/144–163; 331/15–17; 375/373–376
See application file for complete search history.

(56) References Cited

U.S. PATENT DOCUMENTS

| 5,313,503 A | 5/1994 | Jones et al. |
| 6,028,488 A | 2/2000 | Landman et al. |
| 7,352,297 B1 * | 4/2008 | Rylyakov et al. ............ 341/50 |
| 2002/0033732 A1 | 3/2002 | Kirn |
| 2002/0079937 A1 | 6/2002 | Xanghopoulos |
| 2003/0107442 A1 | 6/2003 | Staszewski |
| 2004/0066240 A1 | 4/2004 | Staszewski et al. |
| 2007/0085621 A1 | 4/2007 | Staszewski et al. |
| 2007/0205931 A1 | 9/2007 | Vanselow et al. |

OTHER PUBLICATIONS

Tierno et al., A Wide Power Supply Range, Wide Tuning Range, All Static CMOS All Digital PLL in 65 nm SOI; IEEE Journal of Solid-State Circuits, vol. 4, No. 1; Jan. 2008; pp. 1-10.

* cited by examiner

*Primary Examiner*—Lincoln Donovan
*Assistant Examiner*—Brandon S Cole
(74) *Attorney, Agent, or Firm*—Tutunjian & Bitetto, P.C.; Anne V. Dougherty, Esq

(57) ABSTRACT

PLL (phase locked loop) circuits and methods are provided in which PWM (pulse width modulation) techniques are to achieve continuous fine tuning control of DCO (digitally controlled oscillator) circuits. In general, pulse width modulation techniques are applied to further modulate dithered control signals that are used to enhance the frequency tuning resolution of the DCO such that the dithered control signals are applied to the fractional tracking control port of the DCO for a selected fraction of a full clock signal based pulse width modulation applied.

14 Claims, 6 Drawing Sheets

PHASE-LOCKED LOOP CIRCUITS AND METHODS IMPLEMENTING PULSEWIDTH MODULATION FOR FINE TUNING CONTROL OF DIGITALLY CONTROLLED OSCILLATORS

TECHNICAL FIELD OF THE INVENTION

The present invention relates generally to PLL (phase locked loop) circuits and methods and, in particular, digital PLL circuits and methods implementing PWM (pulse width modulation) to achieve continuous fine tuning control of DCO (digitally controlled oscillator) circuits.

BACKGROUND

In general, various types of communications systems are implemented using phase-locked loop (PLL) circuits to generate clock signals. For example, PLL circuits are used in transceiver circuits for generating LO (local oscillator) signals, data recovery circuits for generating clock recovery signals, and frequency synthesizer circuits for generating stable frequency output signals over a large continuous tuning range. In general, a PLL circuit uses feedback to maintain an output signal of the PLL in a specific phase relationship with a reference input signal of the PLL, as is well known in the art. When the output frequency of the PLL is equal to the frequency of the reference input signal, the PLL is in a "locked" condition. A frequency synthesizer circuit is essentially a PLL circuit that employs a programmable frequency divider in a PLL feedback loop. PLL circuits can be implemented using analog and/or digital circuits, depending on the application.

By way of example, FIG. 9 is a high-level schematic illustration of a conventional analog PLL frequency synthesizer circuit (10). The PLL frequency synthesizer (10) comprises a PFD (phase-frequency detector) circuit (11), a charge pump (12), a loop filter (13), a VCO (voltage controlled oscillator) circuit (14), and a frequency divider (15) in a PLL feedback loop. In general, the PLL frequency synthesizer (10) generates an output signal Vout having a frequency $f_{out}$ that is some multiple N of the frequency $f_{Ref}$ of a reference clock signal Ref_CLK, where $f_{out}=N\times f_{Ref}$. The PFD circuit (11) receives the input reference signal Ref_CLK and a feedback signal $f_{Div}$ and compares the phases of such signals. The PFD (11) generates a slowly varying phase error output signal that is a function of the phase difference between the reference and feedback signals. The charge pump (12) operates in conjunction with the PFD (11) to generate an output current signal based on the detected phase difference using matched current sources. In general, the charge pump (12) and loop filter (13) operate to amplify and filter the phase error signal output from the PFD (11) according to a filter transfer function that is selected to achieve desired loop characteristics such as gain, bandwidth, frequency response, etc., in a manner well known in the art. The loop filter (13) built from resistors and capacitors low-pass filters the phase error signal generated by the PFD (11) and CP (12) and outputs a control voltage to the VCO (14).

The control voltage output from the loop filter (13) is a control signal that is input to a control port of the VCO (14). The VCO (14) may be a voltage controlled LC tank oscillator where frequency tuning is achieved based on the voltage level of the control signal output from the loop filter (13). The control signal could be applied to a variable capacitor or varactor in the case of an LC (inductor-capacitor) VCO, or applied to one or more current sources in the case of a current-starved or delay-interpolating ring VCO. The control signal voltage incrementally increases or decreases so as to drive the VCO (14) output frequency $f_{out}$ in the direction of $N\times f_{Ref}$. The output signal $V_{out}$ is fed back to the PFD (11) via the frequency divider circuit (15), which divides the VCO output frequency by the division ratio N to generate a low frequency signal $f_{Div}$. When $f_{Ref}=f_{Div}$, the PLL frequency synthesizer achieves the desired "locked" state.

In advanced semiconductor technologies, the ability to realize good analog PLL circuit performance is problematic, especially as target supply voltages are reduced and operating frequencies increase. Moreover, for mixed digital/analog integrated circuit designs, the realization of a PLL using traditional analog frameworks places demands on the underlying process technology which are significantly different from those driven by high-speed digital logic requirements. Indeed, analog PLL circuits typically require elements that are not used in standard digital logic circuits such as resistors and low leakage capacitors, and analog circuits rely on properties that are not critical to standard logic circuits such as matching and output impedance uniformity.

In this regard, all digital PLL circuit topologies have been developed to address issues associated with analog PLLs. In general, a digital PLL includes a digital phase detector, a digital loop filter (instead of the traditional analog filter), and a digitally-controlled oscillator (DCO) (instead of a VCO as in the analog PLL). A DCO is an oscillator that operates at a frequency controlled by the value of a digital control word that is generated by the digital loop filter. With digital PLLs, signal processing and filtering is performed in the digital domain and a digitally-realized loop filter is much smaller in framework and is more programmable than the capacitor-dependent analog filter frameworks used in analog PLLs.

The digital loop filter provides a digital output that is used as a control signal to frequency tune the DCO. In general, a DCO includes tuning control circuits with tuning elements that are driven by the digital control word logic inputs. The DCO tuning elements may include, for example, non-linear capacitors in an LC DCO that are driven on and off by the control signals to frequency tune the DCO. In other conventional embodiments, the DCO elements may be a plurality of active inverter stages in a ring DCO, wherein frequency tuning is achieved by incrementing/decrementing the number of active inverter stages in a ring DCO.

The digital PLL requires a continuous tuning range, which means that small frequency steps are needed. For example, in a ring DCO, a single frequency step is equivalent to the delay of a unit cell inverter, and in an LC DCO, a frequency step is a capacitance of a unit cell varactor. If the frequency step between adjacent digital control settings is too large, however, it will not be possible to realize a PLL with a low-noise output. One method of providing a lower incremental frequency change per digital step is by using smaller tuning elements (e.g., smaller inverters or varactors). However, the ability to achieve the required fine-grain digital tuning of the LC DCO using this approach can be problematic because there are inherent tradeoffs between fixed capacitance and controllable capacitance associated with changing the size of the digitally controlled capacitor. Indeed, the smaller the controllable step, the more fixed capacitance is introduced as a fraction of total capacitance, and thus the smaller the achievable overall DCO tuning range becomes. The growth in fixed capacitance occurs in large part because the wiring needed to connect the digitally controlled capacitors grows as capacitor count grows. Furthermore, there may be process technology limits that affect how small a controllable capacitor can be.

In other conventional methods, fine tune control of DCOs can be implemented by using dither control circuits such as sigma delta modulator circuits to encode fractional frequency control bits into dithering signal that are input to the DCO to increase the frequency tuning resolution by rapidly switching tuning elements on and off. Although the dithered control process enhances resolution, the dither control bit still provides a large frequency step based on the size of each unit tuning element of the DCO. Moreover, once the switching frequency is realized as high as possible (limited by the electronics, available clock rates, power dissipation), and the step size is minimized the step size, dithered control may be insufficient to achieve the desired tuning accuracy. As such, new techniques to further enhance the frequency tuning resolution of DCO circuits in PLL circuits and other circuits are highly desirable.

SUMMARY OF THE INVENTION

Exemplary embodiments of the invention include digital PLL circuits and methods that implement PWM (pulse width modulation) to achieve continuous fine tuning control of DCO (digitally controlled oscillator) circuits. In general, exemplary embodiments of the invention realize lower incremental frequency change per digital step by applying pulse width modulation to dithered control signals, and applying pulse width modulated dithered control signals to dithered control input port of the DCO to drive fractional frequency tuning elements of a DCO.

In one exemplary embodiment of the invention, the phase-locked loop (PLL) circuit includes a digitally controlled oscillator (DCO) circuit to generate a DCO output signal in response to an n-bit digital frequency control signal comprising an integer portion and a fractional portion, a dithering circuit that encodes the fractional portion of the digital frequency control signal to generate dithering control signals (DITH), and a pulse width modulation circuit that uses the DITH signal and the DCO output signal to generate pulse width modulated dither control signals, wherein the pulse width modulated dither control signals are input to a dithered fractional frequency control port of the DCO to drive frequency dithering tuning elements. In one embodiment of the invention, the dither circuit is a delta-sigma modulation circuit and a digital loop filter generates the n-bit digital frequency control signal, wherein the integer portion is directly input to an integer tracking input control port of the DCO.

The pulse width modulation circuit can be implemented in various frameworks. For instance, in one exemplary embodiment, the pulse width modulation circuit includes a series of frequency divider circuits, which generate a plurality of divided oscillator clock signals from the DCO output signal, and a logic encoder that encodes the divided oscillator clock signals and the DCO output signal to generate the pulse width modulated dither control signals.

In another exemplary embodiment of the invention, the pulse width modulation circuit includes a phase rotator, an Exclusive-OR (XOR) logic circuit, and an AND logic circuit. The phase rotator receives clock inputs C1_0 and C1_90 (quadrature signals) wherein C1_0 is the DCO output signal and C1_90 is the DCO output signal phase-shifted by 90 degrees, incrementally applies a positive or negative phase shift to the DCO output signal in response to a phase select control signal, and generates a phase shifted clock signal CROT. The XOR circuit combines the signal C1_0 or C1_90 with the CROT signal to generate a modulating signal CPWM with a variable pulse width. The CPWM and DITH signals are input to the AND logic circuit and logically ANDed to generate the pulse width modulated dither signal.

In another exemplary embodiment of the invention, the pulse width modulation circuit includes a delayed lock loop circuit that receives as input the DCO output signal and DITH signal and outputs a delayed DCO output signal, and an Exclusive-OR (XOR) logic circuit that receives as input the DCO output signal and delayed DCO output signal and exclusively ORs said input signals to generate the pulse width modulated dither signal. The delayed lock loop circuit may include a phase detector that compares phases of the DCO output signal and the delayed DCO output signal, a loop filter that filters an output of the phase detector, a delay line that receives as input the DCO output signal and which is driven by an output signal of the loop filter to generate a plurality of delayed versions of the DCO output signal, a multiplexer, and an encoder that encodes the DITH signals and generates a multiplexer control signal to drive the multiplexer to output a selected one of the delayed versions of the DCO output signal.

In accordance with exemplary embodiments of the invention, rather than applying the dithered control signals to tuning controlled element in the DCO (e.g. capacitor in the LC DCO or inverter in the ring DCO) for a full clock cycle as in conventional schemes, pulse width modulation is applied to the dithered control signals so that the dithering control inputs are applied for a fractional clock cycle, rather than a full clock cycle. In this manner, the fraction of the full cycle can be made arbitrarily small (limited only by the maximum digital clock frequency which the process technology can support) thus achieving almost continuous tuning of the DCO, and thereby allowing a wide continuous tuning range without the use of analog techniques or circuits.

These and other exemplary embodiments, features and advantages of the present invention will be described or become apparent from the following detailed description of exemplary embodiments, which is to be read in connection with the accompanying drawings.

DETAILED DESCRIPTION OF EXEMPLARY EMBODIMENTS

Figure 1:
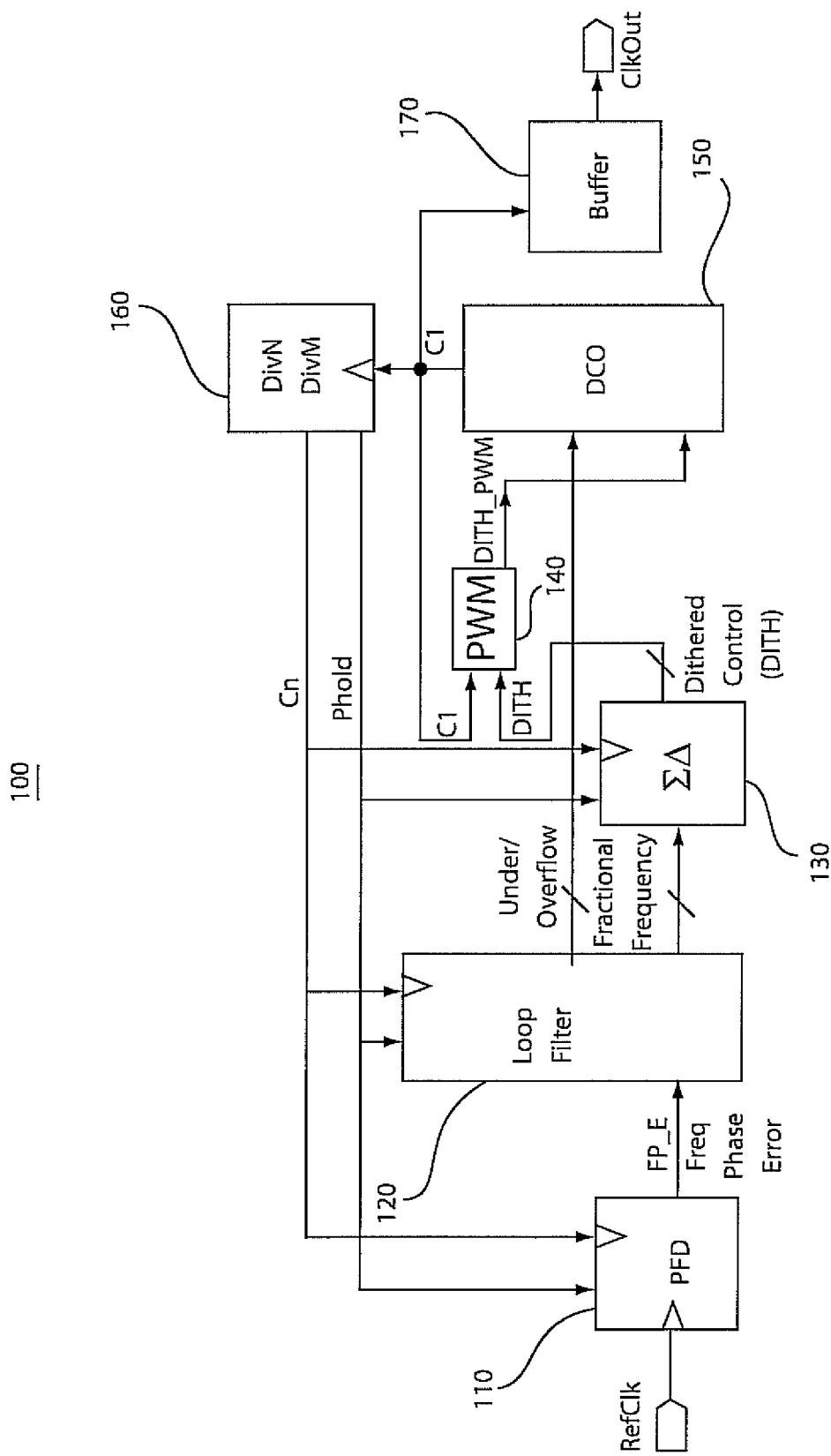
FIG. 1 is a schematic block diagram of a digital PLL (phase locked loop) circuit implementing pulse width modulation for fine tune control of a digitally controlled oscillator, according to an exemplary embodiment of the invention.

FIG. 1 is a schematic block diagram of a digital phase locked loop (DPLL) circuit (100) according to an exemplary embodiment of the invention. The DPLL (100) comprises a phase/frequency detector (110) (or "PFD" circuit), a digital loop filter (120), a sigma/delta modulator (130) (or "SDM" circuit), a pulse width modulator (140) (or "PWM" circuit), a digitally controlled oscillator (150) (or "DCO" circuit), a frequency divider (160), and an output buffer (driver) (170). In general, the PFD (110) compares the reference clock REF_Clock and divided clock CN and generates frequency/phase error (FP_E) signal. The loop filter (120) filters the FP_E signal to generate a DCO tuning control signal for the DCO (150). The control signal output from the loop filter (120) is divided into most significant bits (under/overflow control bits) that are directly input to the DCO (150) and least significant bits (fractional frequency control bits) that are input to the SDM (130). The SDM (130) modulates the frequency control bits to generate a dithered control signal (DITH) which, in conventional PLL circuits, are input to a dithered control input port of the DCO (150) to enhance the frequency resolution of the DCO (150).

In accordance with an exemplary embodiment of the invention, the dither control signal DITH is processed by the PWM circuit (140) to further modulate the dithered frequency tracking bits and generate control signals to further refine the frequency resolution of the DCO (150). The PWM (140) outputs a DITH_PWM control signal as a modified version of the DITH control signal, wherein the dithered control signals are active for a fractional clock cycle instead of a full clock cycle, as in conventional circuit designs. The DCO (150) is directly controlled by the modulated dither signals DITH_PWM output from the PWM circuit (140) and the control bits (under/overflow) output from the loop filter (120).

The frequency divider (160) divides the frequency of the DCO output signal (C1) by a user-settable ratio (DivN, DivM) and generates the divided frequency output signal CN. The frequency divider (160) divides the DCO output clock signal C1 to generate a clock gating signal Phold (or phase hold). The Phold signal is de-asserted one pre-scaled clock out of N, where N is an integer between one and eight. The Phold signal is used to gate the CN signal effectively creating a slower clock C1/(N×M).

The PFD (110) compares the signal CN to a reference frequency (RefClk) signal which is an input to the chip. If CN is higher or lower than RefClk, the DPLL decrements or increments the control signals (Under/Overflow and Dithered Control) to decrease or increase the VCO frequency, respectively. The output signal C1 of the DCO (150) is input to the buffer (driver) (170), which drives the output clock ClkOUT of the PLL (100).

The DCO (150) frequency can be tuned by digitally controlling physical parameters of an oscillator. For instance, in an LC-tank based VCO, the tank capacitance can be implemented using an array of capacitance devices, such as varactors, in the LC tank, where the capacitance of the tank is adjusted by switching varactors on and off one at a time. In an inverter-ring based DCO, the inverters that comprise a ring are divided into addressable components, wherein the effective strength of the composite inverters is adjusted by increasing or decreasing the number of enabled transistors that form each stage of the ring.

In one exemplary embodiment of the invention, the PFD (110) is a "bang-bang" phase and frequency detector (PFD) that compares arrival times of the reference clock REF_Clock and divided clock CN edges and generates early/late information. The PFD (110) operates as a frequency detector and a phase detector. During a frequency capture period, the output of the PFD (110) indicates whether the frequency of the REF_Clk or the CN signal is higher. Once the two frequencies are sufficiently close, the output of the PFD indicates, with some amount of delay, the leading phase (where the "late" signal indicates that the REF_Clk lead and wherein the "early" signal indicates that the CN signal leads).

The loop filter (120) may be a programmable, digital proportional-differential-integral (PDI) digital filter that operates at the divided output frequency CN to generate control signals for the DCO. When the digital PLL (100) is in a locked state, the loop filter (120) operates at the same frequency as the REF_Clk signal. In lock, an output is computed for every reference cycle. Operations may be performed using 5 bits of resolution. Underflows and overflows are passed to the DCO control for further accumulation. A proportioned-differential section of the loop filter generates an overflow or underflow signal, which is used to turn on or off one of the dithering inverters in the DCO, thus affecting the frequency of the oscillator for the current REF_Clk cycle only. An integral portion of the loop filter accumulates the error signal from the PFD multiplied by a programmable integration constant. The overflow or underflow of the accumulator causes assertion of the control signal, which increases or decreases the output frequency of the DCO (150). The quantity obtained by adding the output of the integrator and the proportional-differential section represents the fraction of an inverter that should be enabled, wherein the quantity is the "fractional frequency", as it encodes a step size that is a fraction of a minimum DCO discrete step. The signal is output to the SDM circuit (130), which converts the target fractional value into controls for the dithering inputs to the DCO (150).

The SDM (130) is used to encode the fractional frequency generated by the loop filter (120) into dithering signals DITH. The SDM operates at the divided clock signal CN and oversamples the output of the loop filter by the clock division ratio M. The use of phase hold to implement the clock division facilitates the handoff of data from the divided clock to the prescaled clock.

In general, the PWM circuit (140_1) applies pulse width modulation to the dithered control signal (DITH) so that the dithered control signal (DITH) is only active for a fractional clock cycle instead of a full clock cycle as in conventional methods. One such technique is pulse-width modulation. Pulse width modulation generates a pulse as a representation of a quantity somewhere between the two digital levels, where the fractional value has been encoded as time, on the width of the pulse.

Figure 2:
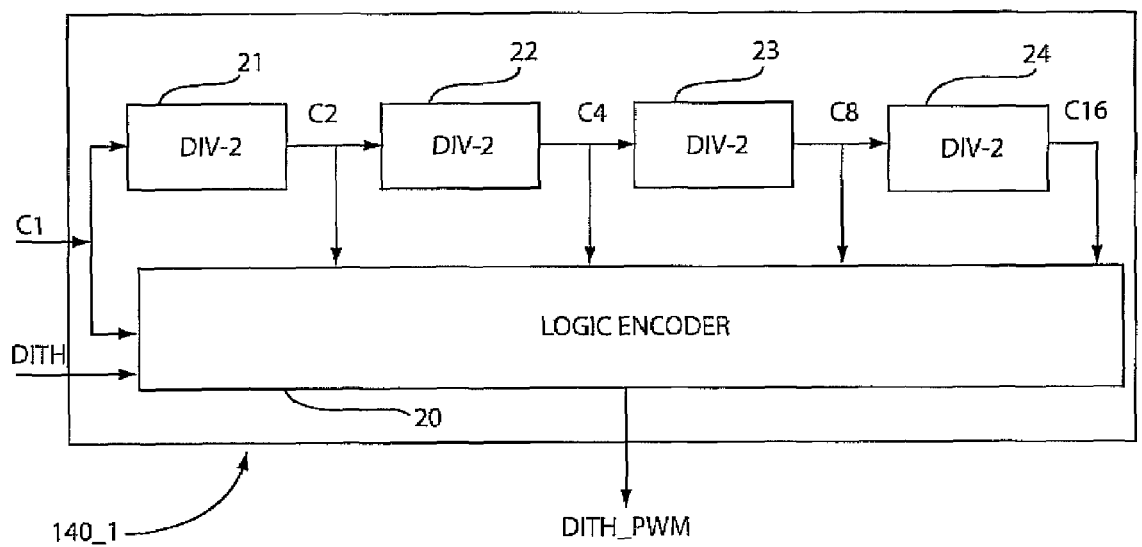
FIG. 2 schematically illustrates a PWM (pulse width modulation) circuit that may be implemented in the PLL circuit of FIG. 1, according to an exemplary embodiment of the invention, FIG. 3 schematically illustrates a logic encoder circuit that may be implemented in the PWM circuit of FIG. 2, according to an exemplary embodiment of the invention.

FIG. 2 schematically illustrates a PWM circuit according to an exemplary embodiment of the invention. FIG. 2 illustrates a PWM circuit (140_1) which may be implemented for the PWM (140) in the DPLL (100) of FIG. 1. In general, the PWM circuit (140_1) of FIG. 2 receives as input a dithered control signal DITH output from the SDM (120) and the clock signal (C1) output from the DCO (150), and outputs a pulse width modulated dithered control signal (DITH_PWM). In general, the PWM circuit (140_1) applies pulse width modulation to the dithered control signal (DITH) so that the dithered control signal (DITH) is only active for a fractional clock cycle instead of a full clock cycle as in conventional methods.

In general, the PWM circuit (140_1) includes a logic encoder (20) and a series of divide-by-two (DIV-2) circuits (21, 22, 23, 24) that provide clocks signals at ½, ¼, ⅛, and ⅟16 of the full-rate clock (C1). In the exemplary embodiment of FIG. 2, the DCO clock signal (C1) is input to the first DIV-2 circuit (21) to generate a clock signal C2 that is ½ A the full-rate of clock signal C1. The clock signal (C2) is input to the second DIV-2 circuit (22) to generate a clock signal C4 that is ¼ the full-rate of clock signal C1. The clock signal (C4) is input to the third DIV-2 circuit (23) to generate a clock signal C8 that is ⅛ the full-rate of clock signal C1. The clock signal (C8) is input to the fourth DIV-2 circuit (24) to generate a clock signal C16 that is ⅟16 the full-rate of clock signal C1.

The logic encoder (20) receives as input the DCO clock signal C1, divided clock signals C2, C4, C8 and C16, and the dithered control signal DITH, and encodes the input signals to generate the pulse width modulated dither signal DITH_PWM, which is output to the DCO (150). In the exemplary embodiment, the encoder (20) is configured to modulate the duty cycle of the dithered control signal DITH using different combinations of the clock signals C1, C2, C4, C8, C16, for example, to generate pulse width modulated dither signal DITH_PWM having one of a plurality of lower duty cycles to control the amount of power applied to the load in the DCO control circuitry.

Figure 3:
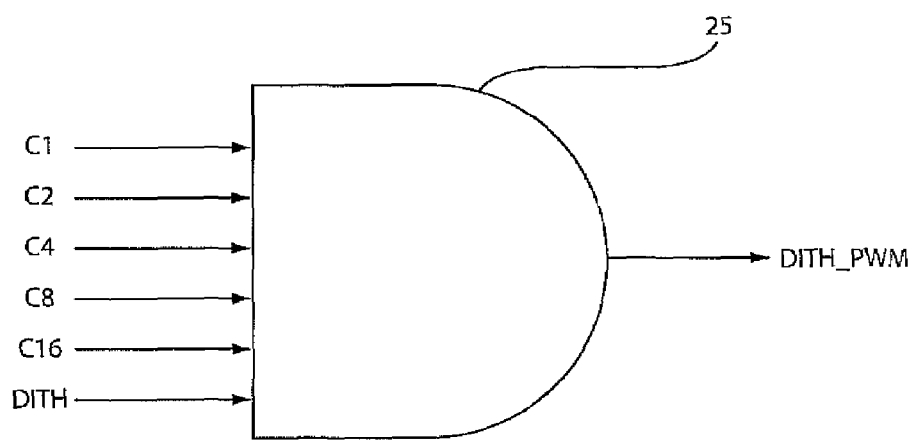

An exemplary method for generating a pulse width modulated dither signal for fractional frequency tuning control will now be discussed with reference to FIGS. 3 and 4A-4H. In particular, FIG. 3 schematically illustrates an encoder circuit (25) according to an exemplary embodiment of the invention, which may be implemented in the logic encoder (20) of FIG. 2 to generate a pulse width modulated dither control signal DITH_PWM using clock signals C1, C2, C4, CB and C16. FIGS. 4A~4H are timing diagrams that illustrate an exemplary mode of operation of the PWM circuit of FIGS. 2 and 3, according to an exemplary embodiment of the invention. In FIG. 3, the encoder (20) (of FIG. 2) may comprise an "AND" circuit (25) that performs a logic AND operation on input signals C1, C2, C4, C8 and C16, and dither control signal DITH to generate a DITH_PWM with duty cycle of ⅟16 of the dither control signal DITH.

FIGS. 4A, 4B, 4C, 4D and 4E are timing diagrams illustrating the clock signals C1, C2, C4, C8 and C16, respectively. FIG. 4A illustrates a DCO clock signal C1 with a frequency of 500 MHz (with period of 2 ns) which is used to generate divided clock signals with ½, ¼, ⅛, and ⅟16 the frequency of C1. The combination (logic AND) of the clocks C1, C2, C4, C8 and C16 results in a control pulse in one of 16 possible time slots. FIG. 4G illustrates a control pulse signal Slot 1 that results from the ANDing of the signals C1, C2, C4, C8 and C16. The Slot 1 signal has a pulse width of 1 ns.

The signal in 4G is ANDed with the DITH signal in FIG. 4F to generate the pulse width modulated dither signal DITH_PWM illustrated in FIG. 4H. In this exemplary method, the DITH_PWM has a duty cycle that is ⅟16 (or 6.25%) of the duty cycle of the dithered control signal DITH.

Figure 4:
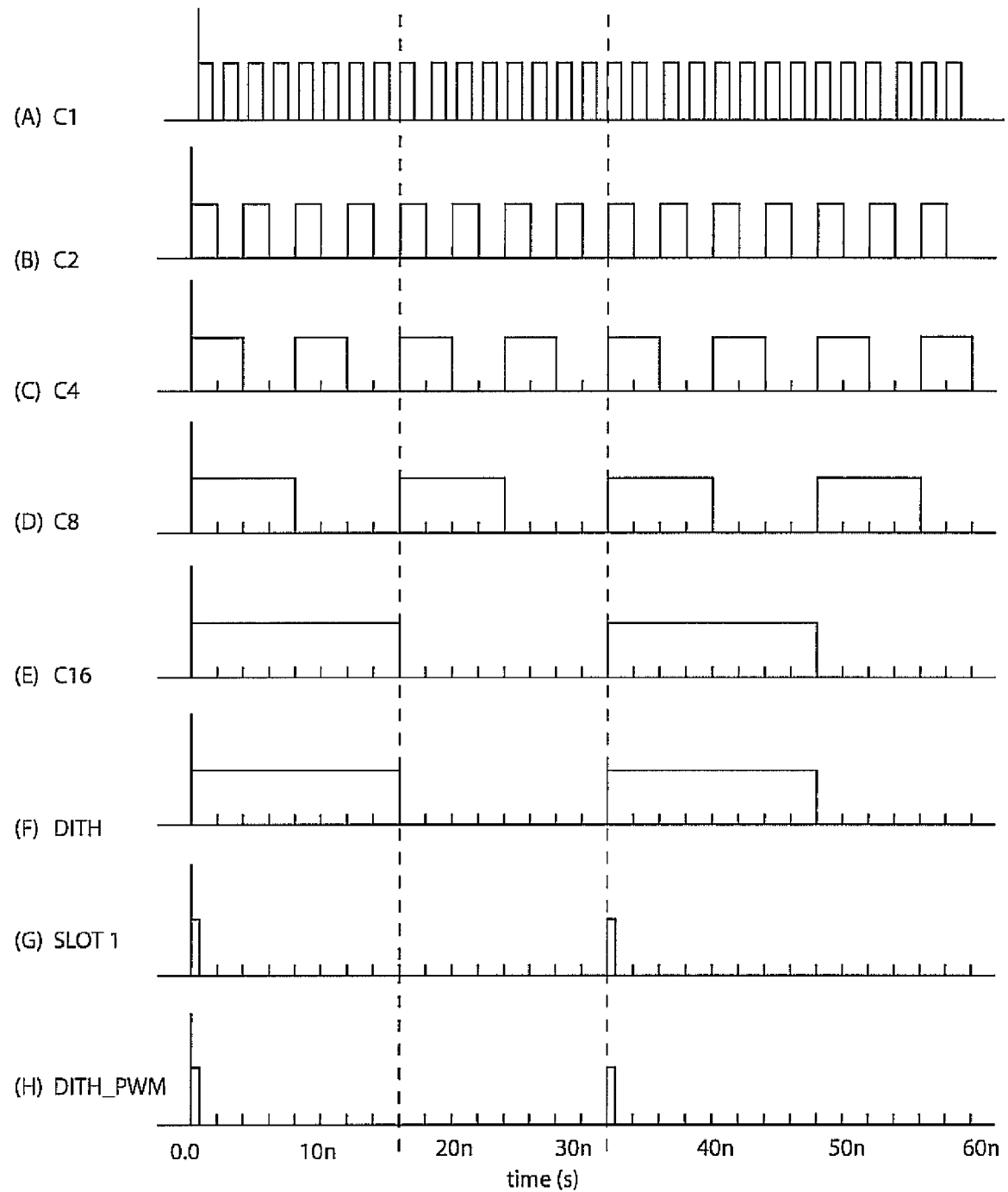
FIGS. 4A-4H are timing diagrams that illustrate an exemplary mode of operation of the PWM circuit of FIG. 2, according to an exemplary embodiment of the invention.

It is to be understood that FIGS. 3 and 4 illustrate one exemplary encoding circuit and method for generating DITH_PWM with a 6.25% duty cycle of DITH. The logic encoder (20) of FIG. 2 may comprise a plurality of AND gates similar to FIG. 3, but which have different combinations of input clock signals to generate DITH_PWM signals with varying duty cycles. For instance, another AND circuit may be included in the encoder (20) of FIG. 2, which is similar to the encoder (25) of FIG. 3, but which logically ANDs C2, C4, C8, C16 and DITH. In such instance, in the example timing diagrams of FIG. 4, the DITH_PWM signal would have a pulse width of 2 ns, providing has a duty cycle that is ⅖16 (or 12.5%) of the duty cycle of the dithered control signal DITH.

Similarly, other combinations of the clock signals could be encoded to generate DITH_PWM signals with ⅟16 (25%) or ⅛⁄16 (50%) duty cycles, for example.

Figure 5:
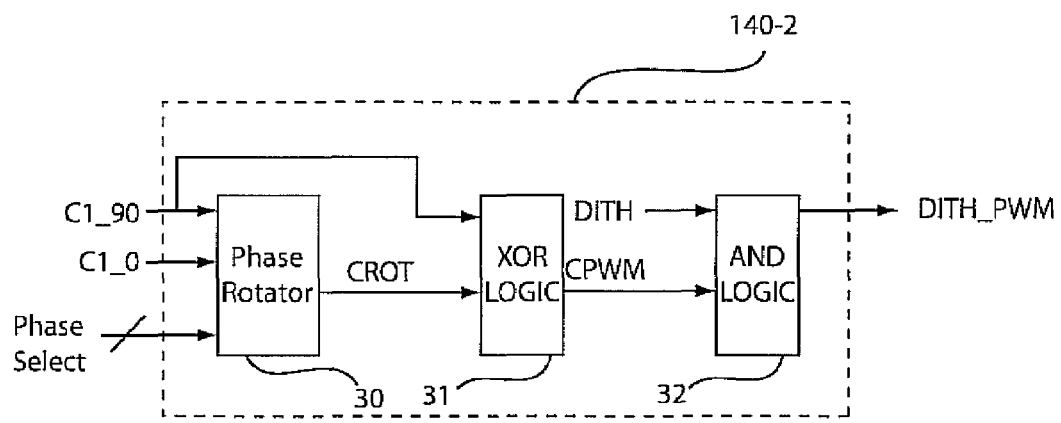
FIG. 5 schematically illustrates a PWM circuit that can be employed in the PLL circuit of FIG. 1, according to another exemplary embodiment of the invention.

FIG. 5 schematically illustrates a PWM circuit according to an exemplary embodiment of the invention. FIG. 5 illustrates a PWM circuit (140_2) with a phase rotator implementation, which may be implemented for the PWM (140) in the DPLL (100) of FIG. 1. In general, the PWM circuit (140_2) comprises a phase rotator (30), an Exclusive-OR (XOR) logic circuit (31) and an AND logic circuit (32). The phase rotator (30) receives clock inputs C1_0 and C1_90 (quadrature signals) wherein C1_0 is the DCO output signal C1 and C1_90 is the C1 clock signal phase-shifted by 90 degrees. The phase rotator (30) incrementally applies a positive or negative phase shift to the clock signal C1 in response to a phase select control signal and generates a phase shifted clock signal CROT. In one exemplary embodiment of the invention, the phase rotator (30) is designed to perform phase interpolation to generate the desired output phases by interpolating between the I and Q input phases. In particular, the phase rotator (30) may be constructed with a circuit topology that performs phase shifting by linearly combining I and Q signals in appropriate ratios in the current or voltage domain to achieve a desired phase shift resolution.

The XOR circuit (31) combines the clock signal C1_0 or C1_90 with the output signal CROT to generate a modulating signal CPWM with a variable pulse width. The signal CPWM and DITH signals are input to an AND circuit (32), where the CPWM signal is logically AND'ed with the dither control signal DITH to generate the pulse width modulated dither signal DITH_PWM.

Figure 6:
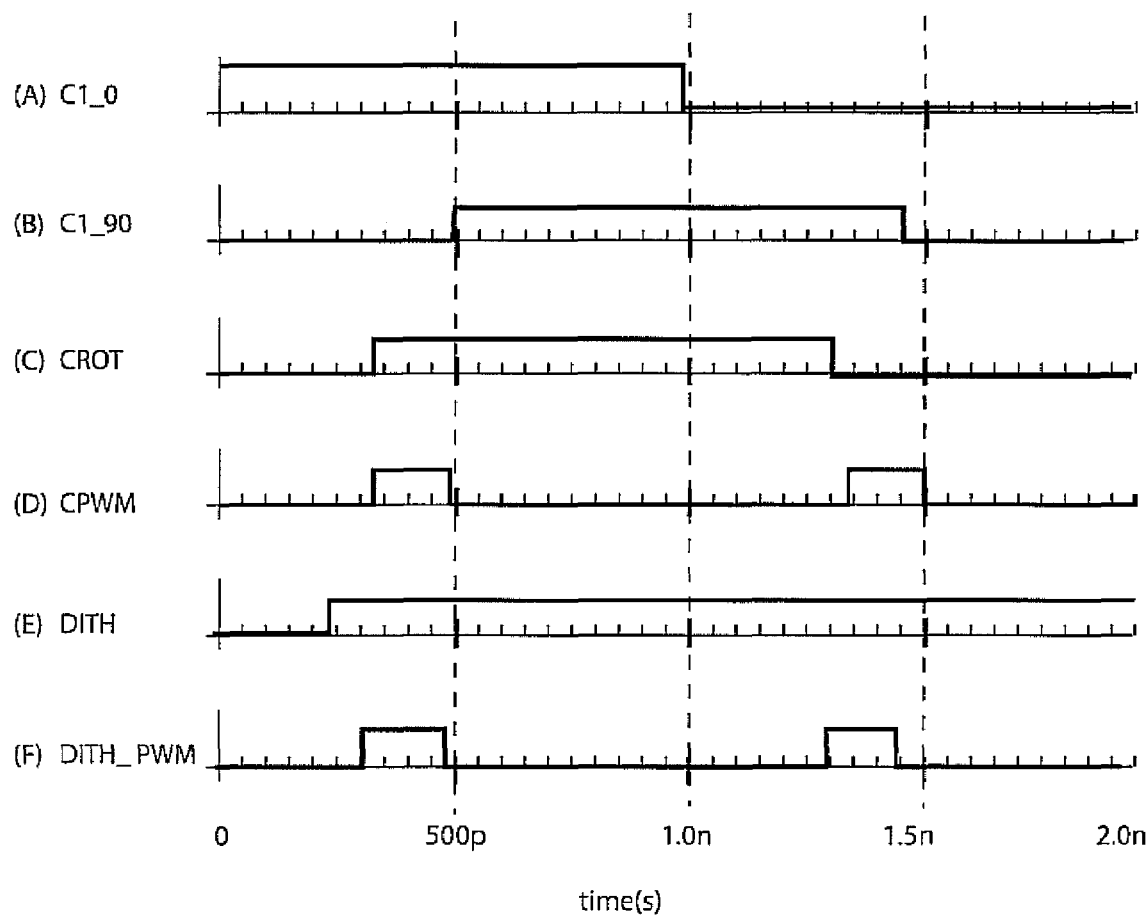
FIGS. 6A-6F are timing diagrams that illustrate an exemplary mode of operation of the PWM circuit of FIG. 5, according to an exemplary embodiment of the invention.

A method for pulse width modulating dither control signals using the PWM circuit (140_2) of FIG. 5 is illustrated by the exemplary timing diagrams of FIGS. 6A~6F, which illustrate an exemplary mode of operation of the PWM circuit of FIG. 5, according to an exemplary embodiment of the invention. In particular, FIGS. 6A and 63 illustrate quadrature clock signals C1_0 and C1_90, respectively. For purposes of illustration, it may be assumed that the signal C1_0 is the same as the signal C1 in FIG. 4A, and that C1_90 is the clock signal C1 with a 90 degree phase shift (i.e., the clock signal C1_90 has the same frequency of C1_0, but phase shifted by 90 degrees). FIG. 6C illustrates a rotated clock signal CROT signal output from the phase rotator (30). FIG. 6D illustrates an exemplary CPWM signal that is output from the XOR gate (31), which is generated by exclusive-ORing the CROT and C1_90 signals in respective FIGS. 6C and 6B. FIG. 6E illustrates an exemplary dither control signal DITH. FIG. 6F illustrates a pulse-width modulated dither signal DITH_PWM that is generated by ANDing the DITH signal of FIG. 6E with the CPWM signal of FIG. 6D.

Figure 7:
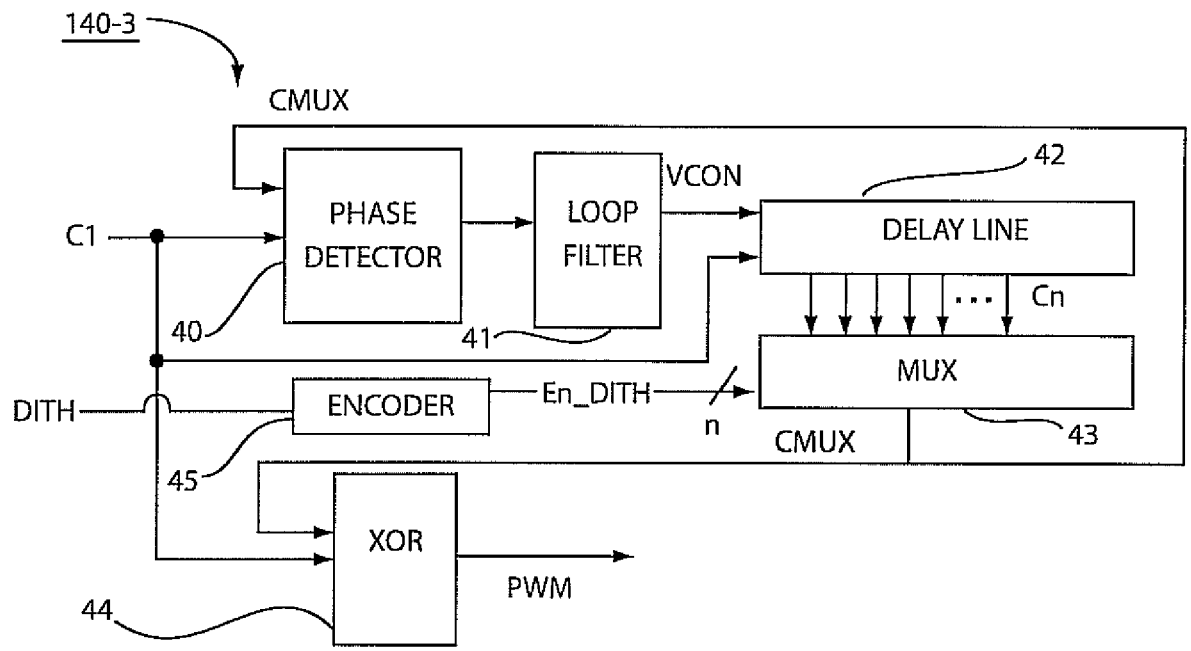
FIG. 7 schematically illustrates a PWM circuit that may be implemented in the PLL circuit of FIG. 1, according to another exemplary embodiment of the invention.

FIG. 7 schematically illustrates a PWM circuit according to another exemplary embodiment of the invention. FIG. 7 illustrates a delay-locked loop (DLL) implementation of a PWM circuit (140_3), which may be implemented for the PWM (140) in the DPLL (100) of FIG. 1. In general, the PWM circuit (140_3) comprises a phase detector (40), loop filter (41), a delay line (42), a multiplexer (43), an XOR circuit (44) and an encoder (45). The phase detector (40) compares the phases of the DCO clock signal C1 and a clock signal CMUX output from the MUX (43), and generates a control signal that is filtered by the loop filter (41) to adjust a control signal VCON. The VCON signal is input to the delay line (42) which outputs a plurality of delayed clock signals Cn based on the clock signal C1 in accordance with control signal VCON. The encoder (45) receives the DITH signal and encodes the DITH signal to generate an n-bit control signal EN_DITH that is output to the MUX (43). The MUX (43) outputs one of the delayed clock signals Cn in response to the n-bit EN_DITH control signal. The XOR circuit (44) exclusively ORs the clock signals C1 and CMUX to generate a pulse width modulated control signal PWM.

Figure 8:
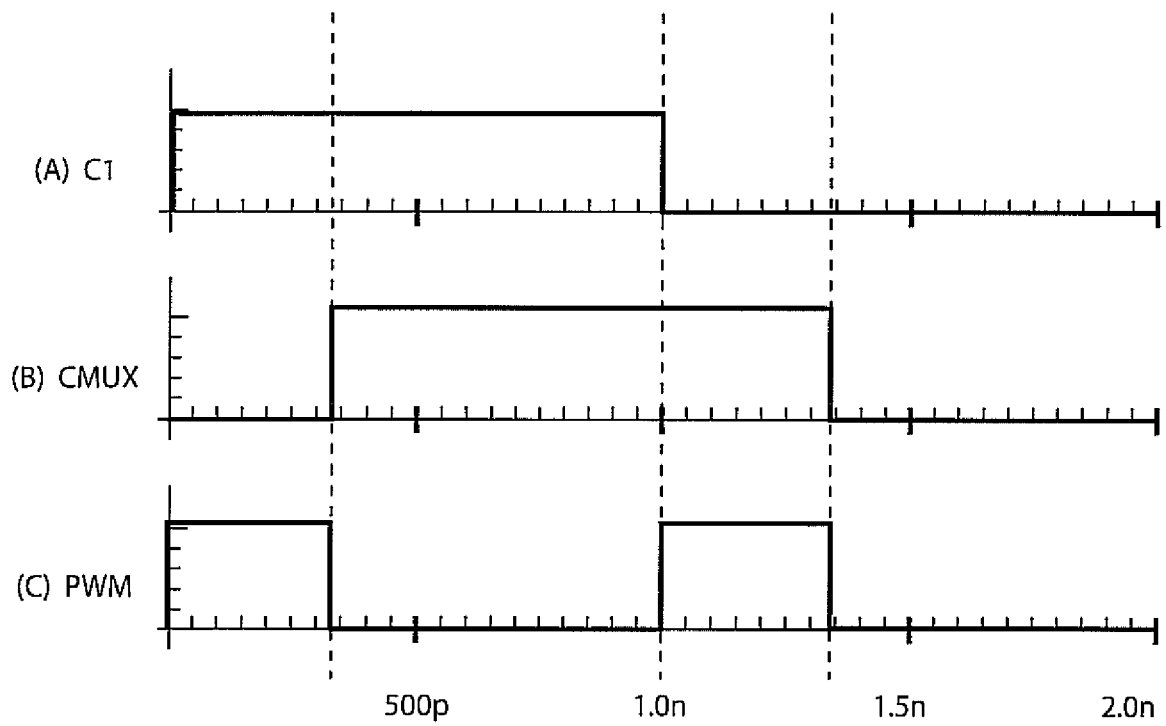
FIGS. 8A-8C are timing diagrams that illustrate an exemplary mode of operation of the PWM circuit of FIG. 7, according to an exemplary embodiment of the invention.
Figure 9:
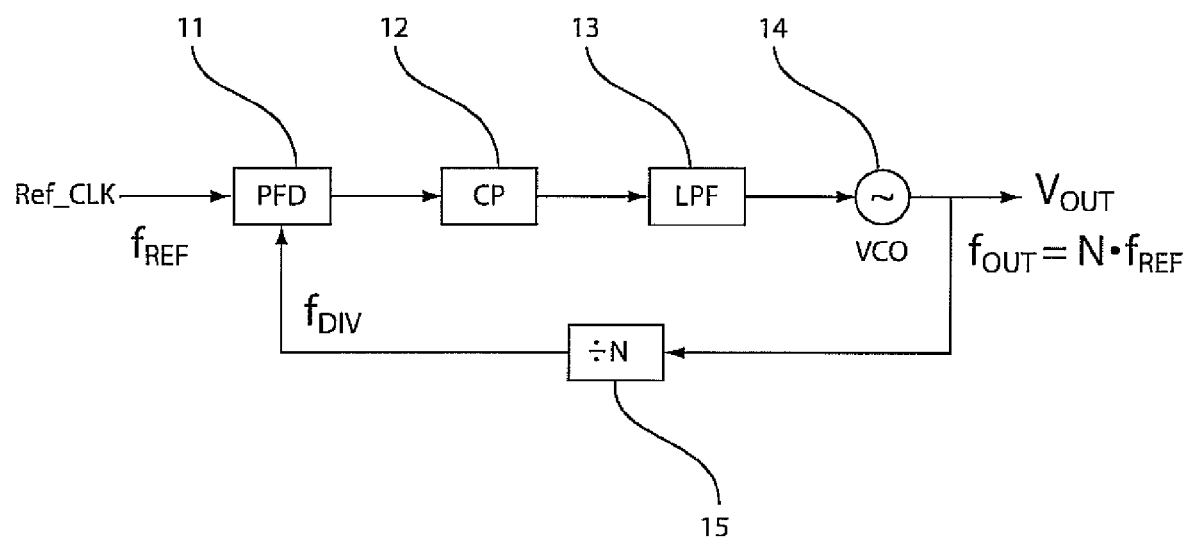
FIG. 9 is a schematic block diagram of a conventional phase-locked loop circuit.

FIGS. 8A~8C are timing diagrams that illustrate an exemplary mode of operation of the PWM circuit of FIG. 7, according to an exemplary embodiment of the invention. In particular, FIGS. 8A and 8B illustrate exemplary input signals to the XOR circuit (44) in FIG. 7 and FIG. 8C illustrates the resulting output signal DITH_PWM. In FIG. 7, the DITH signal is encoded to generate a control signal to output a desired delayed signal CMUX representing one of the delayed C1 signals, Cn. FIG. 8C represents a pulse width modulated version of the DITH signal output where the DITH signal is active for a fractional clock cycle instead of a full clock cycle as in a conventional circuit.

As discussed above, a pulse width modulation of dithered control bits can be implemented using various circuits (e.g. phase rotators, exclusive-OR gates, DLLs etc.), where different pulse widths can be generated, and the desired width can be selected to optimize the PLL performance. The exemplary PWM methods discussed herein may be applied to other circuits in which digital dithering techniques are employed to enhance analog precision, such as digital-to-analog converters (DAC), digital clock-and-data recovery (DCDR) circuits, where, in general, some intermediate analog quantity can be achieved by rapidly switching a digital signal at some frequency.

Although exemplary embodiments have been described herein with reference to the accompanying drawings, it is to be understood that the present invention is not limited to those exemplary embodiments, and that various other changes and modifications may be affected therein by one skilled in the art without departing from the scope or spirit of the invention. All such changes and modifications are intended to be included within the scope of the invention as defined by the appended claims.

We claim:

1. A phase-locked loop (PLL) circuit, comprising:
    a digitally controlled oscillator (DCO) circuit to generate a DCO output signal in response to an n-bit digital frequency control signal comprising an integer portion and a fractional portion;
    a dithering circuit that encodes the fractional portion of the digital frequency control signal to generate dithering control signals (DITH); and
    a pulse width modulation circuit that uses the DITH signal and the DCO output signal to generate pulse width modulated dither control signals, wherein the pulse width modulated dither control signals are input to a dithered fractional frequency control port of the DCO to drive frequency dithering tuning elements.

2. The PLL circuit of claim 1, wherein the dithering circuit is a sigma delta modulation circuit.

3. The PLL circuit of claim 1, comprising a digital loop filter that generates the n-bit digital frequency control signal, wherein the integer portion is directly input to an integer tracking input control port of the DCO.

4. The PLL circuit of claim 1, wherein the pulse width modulation circuit comprises:
    a series of frequency divider circuits which generate a plurality of divided oscillator clock signals from the DCO output signal, and
    a logic encoder that encodes the divided oscillator clock signals and the DCO output signal to generate the pulse width modulated dither control signals.

5. The PLL circuit of claim 1, wherein the pulse width modulation circuit comprises:
    a phase rotator;
    an exclusive-OR (XOR) logic circuit; and
    an AND logic circuit,
    wherein the phase rotator receives clock inputs comprising quadrature signals C1_0 and C1_90 wherein C1_0 is the DCO output signal and C1_90 is the DCO output signal phase-shifted by 90 degrees, and incrementally applies one of a positive and a negative phase shift to the DCO output signal in response to a phase select control signal and generates a phase shifted clock signal (CROT),
    wherein the XOR circuit combines one of the signal C1_0 and the signal C1_90 with the CROT signal to generate a modulating signal (CPWM) with a variable pulse width, and
    wherein the CPWM and DITH signals are input to the AND logic circuit and logically ANDed to generate the pulse width modulated dither signal.

6. The PLL circuit of claim 1, wherein the pulse width modulation circuit comprises:
    a delayed lock loop circuit that receives as input the DCO output signal and DITH signal and outputs a delayed DCO output signal; and
    an exclusive-OR (XOR) logic circuit that receives as input the DCO output signal and delayed DCO output signal and exclusively Ors said input signals to generate the generate the pulse width modulated dither signal.

7. The PLL circuit of claim 6, wherein the delayed lock loop circuit comprises:
    a phase detector that compares phases of the DCO output signal and the delayed DCO output signal;
    a loop filter that filters an output of the phase detector;
    a delay line that receives as input the DCO output signal and which is driven by an output signal of the loop filter to generate a plurality of delayed versions of the DCO output signal;
    a multiplexer; and
    an encoder that encodes the DITH signals and generates a multiplexer control signal to drive the multiplexer to output a selected one of the delayed versions of the DCO output signal.

8. A method for frequency tuning a digitally controlled oscillator (DCO) circuit that generates a DCO output signal, comprising:
    generating a DCO output signal in response to an n-bit digital frequency control signal comprising an integer portion and a fractional portion;
    encoding the fractional portion of the digital frequency control signal to generate dithering control signals (DITH); and
    generating pulse width modulated dither control signals using the DCO output signal and the DITH signal; and
    driving frequency dithering tuning elements of the DCO using the pulse width modulated dither control signals.

9. The method of claim 8, wherein the fractional portion of the digital frequency control signal is encoded using a delta-sigma modulation circuit.

10. The method of claim 8, comprising generating the n-bit digital frequency control signal using a digital loop filter.

11. The method of claim 8, wherein generating a pulse width modulated dither control signals using the DCO output signal and the DITH signal comprises:
    generating a plurality of divided oscillator clock signals from the DCO output signal, and encoding the divided oscillator clock signals and the DCO output signal to generate the pulse width modulated dither control signals.

12. The method of claim 8, wherein generating a pulse width modulated dither control signals using the DCO output signal and the DITH signal comprises:
   generating a phase shifted control signal (CROT) by phase shifting the DCO output signal;
   exclusively ORing the DCO output signal with the CROT signal to generate a modulating signal (CPWM) with a variable pulse width, and
   logically ANDing the DITH and CPWM signals to generate the pulse width modulated dither signal.

13. The method of claim 8, wherein generating a pulse width modulated dither control signals using the DCO output signal and the DITH signal comprises:
   generating a delayed DCO output signal in response to an encoded DITH signal; and
   exclusively ORing the delayed DCO output signal and the DCO output signal to generate the pulse width modulated dither signal.

14. The method of claim 13, wherein generating a delayed DCO output signal comprises:
   comparing phases of the DCO output signal and the delayed DCO output signal;
   filtering a comparison result;
   driving a delay line using the filtered comparison result to generate a plurality of delayed versions of the DCO output signal;
   encoding the DITH signals to generate a multiplexer control signal; and
   driving a multiplexer using the encoded DITH signal to output a selected one of the delayed versions of the DCO output signal.

* * * * *